United States Patent
Ha et al.

(10) Patent No.: US 12,315,567 B2
(45) Date of Patent: May 27, 2025

(54) GROUPED GLOBAL WORDLINE DRIVER WITH SHARED BIAS SCHEME

(71) Applicant: Intel NDTM US LLC, Santa Clara, CA (US)

(72) Inventors: Chang Wan Ha, San Ramon, CA (US); Binh Ngo, Folsom, CA (US); Ahsanur Rahman, Folsom, CA (US); Radhika Chinnammagari, Folsom, CA (US); Sagar Upadhyay, Folsom, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 654 days.

(21) Appl. No.: 17/475,880

(22) Filed: Sep. 15, 2021

(65) Prior Publication Data

US 2023/0082368 A1 Mar. 16, 2023

(51) Int. Cl.
*G11C 16/30* (2006.01)
*G11C 5/06* (2006.01)
*G11C 16/04* (2006.01)
*G11C 16/08* (2006.01)

(52) U.S. Cl.
CPC .......... *G11C 16/08* (2013.01); *G11C 16/0483* (2013.01)

(58) Field of Classification Search
CPC ..... G11C 16/08; G11C 16/0483; G11C 16/30; G11C 5/06; G11C 5/025
See application file for complete search history.

(56) References Cited

U.S. PATENT DOCUMENTS

| | | | |
|---|---|---|---|
| 2002/0131316 A1* | 9/2002 | Noh | G11C 11/4097 365/230.03 |
| 2008/0100335 A1* | 5/2008 | Choi | H03K 19/0005 326/30 |
| 2019/0370167 A1* | 12/2019 | Widder | G06F 3/061 |
| 2021/0142846 A1* | 5/2021 | Lenjani | G11C 7/1006 |
| 2022/0028431 A1* | 1/2022 | Kim | G11C 5/06 |
| 2022/0365719 A1* | 11/2022 | Sun | G06F 3/0659 |
| 2023/0125009 A1* | 4/2023 | Tsai | G11C 5/04 711/154 |

\* cited by examiner

*Primary Examiner* — Hien N Nguyen
(74) *Attorney, Agent, or Firm* — Morgan, Lewis & Bockius LLP (57) ABSTRACT

Systems, apparatuses, and methods may provide for technology that groups a plurality of wordline drivers together and supports these grouped wordline drivers via a shared multiplexer, a shared level shifter, and/or one or more shared multi-well level shifters. In one example, such technology includes a shared multiplexer and a first and second grouped global wordline driver coupled to the shared multiplexer. The shared multiplexer is to access data state information from a plurality of memory cells. The first grouped global wordline driver is to output a first plurality of wordlines associated with a first plane. The second grouped global wordline driver is to output a second plurality of wordlines associated with a second plane, where the second plane is different than the first plane.

16 Claims, 10 Drawing Sheets

| |
|---|
| 232-239 |
| 224-231 |
| 216-223 |
| 208-215 |
| 200-207 |
| 192-199 |
| 184-191 |
| 176-183 |
| 168-175 |
| 160-167 |
| 152-159 |
| 144-151 |
| 136-143 |
| 128-135 |
| 120-127 |
| 112-119 |
| 104-111 |
| 96-103 |
| 88-95 |
| 80-87 |
| 72-79 |
| 64-71 |
| 56-63 |
| 48-55 |
| 40-47 |
| 32-39 |
| 24-31 |
| 16-23 |
| 8-15 |
| 0-7 |

GROUPED GLOBAL WORDLINE DRIVER WITH SHARED BIAS SCHEME

TECHNICAL FIELD

Embodiments generally relate to memory structures. More particularly, embodiments relate to grouped global wordline drivers that share a common multiplexer, a level shifter, and/or multi-well level shifters.

BACKGROUND

NAND-type flash memory ("NAND memory") may be organized into multiple cells, with each cell containing one or more bits of data and being accessible through an array of bit lines (columns) and word lines (rows). In such a case, the number of bits per cell may depend on how many distinct voltage levels can be achieved during program operation(s). As NAND density increases from one generation to the next, the total number of NAND dies for the same amount of storage reduces. The reduced number of NAND dies may degrade read performance because there are fewer opportunities to perform read operations in parallel.

With every generation of memory devices, the number of word lines are increasing to support different bias voltages in algorithms. However, typical global wordline (GWL) driver size remains the same size. Accordingly, increases in the number of wordlines also increases the area consumed by a parallel increases number of global wordline drivers. Often global wordline drivers occupy approximately twenty five percent of the periphery area in current generation products. As global wordline drivers are not significantly shrinking is size, this percentage of consumed periphery area is predicted to grow bigger with each future generation.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

As described above, as global wordline drivers are not significantly shrinking is size, this percentage of consumed periphery area is predicted to grow bigger with each future generation.

As will be descried in greater detail below, to fit more periphery area in less area, the percentage of consumed periphery area is capable of being reduced by collecting multiple global wordline drivers together to share components. For example, grouped global wordline drivers are capable of sharing the biases between multiple drivers and are capable of being collected into groups of 4, 8, 16, or 32, etc. drivers to share a common level shifter. Advantageously, this combination of sharing biases and grouping wordlines is capable of compacting the circuit area significantly.

Figure 1:
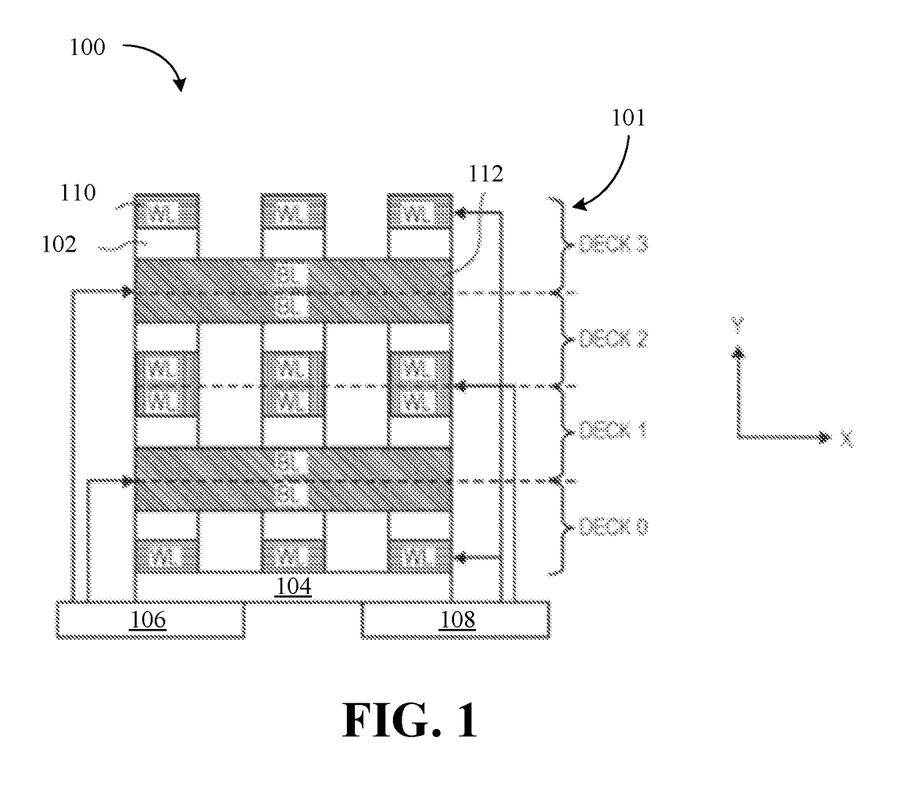
FIG. 1 is a block diagram of an example of a multi-deck non-volatile memory device according to an embodiment.

FIG. 1 is a block diagram of an example of a memory device 100 according to an embodiment. As illustrated, the memory device 100 is a multi-deck non-volatile memory device including a plurality of decks 101 (e.g., Deck 0, Deck 1, Deck 2, and Deck 3, or the like).

In some implementations, each of the decks 101 may include an array of memory cells 102 with conductive access lines (e.g., wordlines 110 and bitlines 112). For example, the memory cells 102 may include a material capable of being in two or more stable states to store a logic value. In one example, the memory cells 102 may include a phase change material, a chalcogenide material, the like, or combinations thereof. However, any suitable storage material may be utilized. The wordlines 110 and bitlines 112 may be patterned so that the wordlines 110 are orthogonal to the bitlines 112, creating a grid pattern or "cross-points." A cross-point is an intersection between a bitline, a wordline, and active material(s) (e.g., a selector and/or a storage material). A memory cell 102 may be located at the intersection of a bitline 112 and a wordline 110. Accordingly, one or more of the decks 101 may include a crosspoint array of non-volatile memory cells, where each of the memory cells may include a material capable of being in two or more stable states to store a logic value.

As illustrated, an electrically isolating material 104 may separate the conductive access lines (e.g., wordlines 110 and bitlines 112) of the bottom deck (e.g., deck 0) from bitline sockets 106 and wordline sockets 108. For example, the memory cells 102 may be coupled with access and control circuitry for operation of the three-dimensional memory device 100 via the bitline sockets 106 and the wordline sockets 108.

Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2X-layer NAND device). The term "deck" will be used throughout this disclosure to describe a layer, a tier, or a similar portion of a three-dimensional memory.

The memory device 100 may include non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

The crosspoint memory array of FIG. 1 is one example of multi-deck non-volatile memory device 100, however, the techniques described herein may not be limited to crosspoint memory, but any memory device, including memory devices with one or multiple layers or multiple decks of memory cells. Thus, memory systems may be designed to have one or more packages, each of which may include one or more memory dies. As will be described in greater detail below, systems, apparatuses and methods of some implementations herein provide for technology that groups a plurality of wordline drivers together and supports these grouped wordline drivers via a shared multiplexer, a shared level shifter, and/or one or more shared multi-well level shifters.

Figure 2:
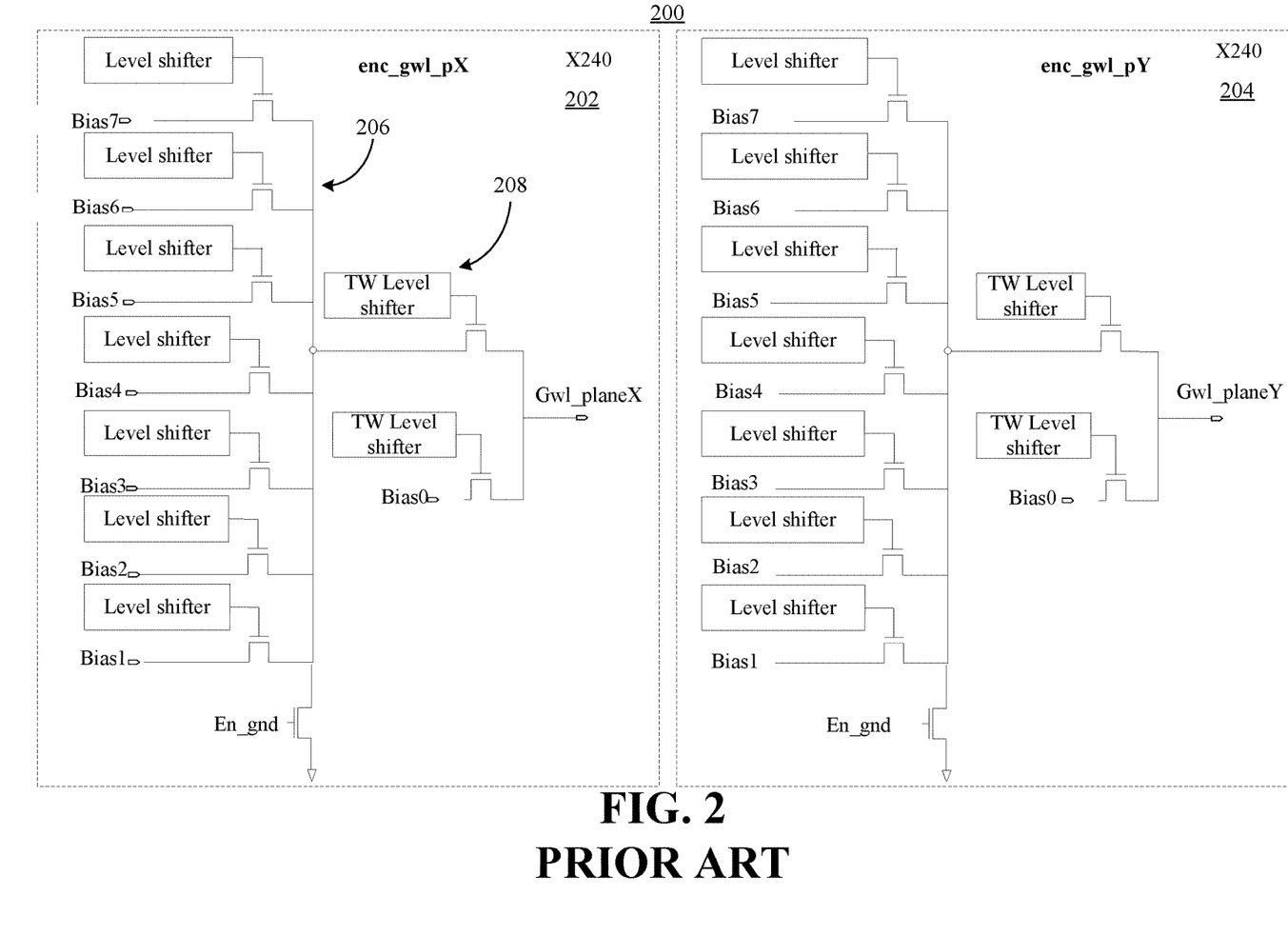
FIG. 2 is a block diagram of an example conventional global wordline driver.

FIG. 2 is a block diagram of an example conventional global wordline driver 200. As illustrated, a first global wordline driver 202 supports a first plane, while a second global wordline driver 204 supports a second plane.

The first global wordline driver 202 is a multiplexer with different voltages as inputs and one of the input voltages is chosen depending on the encoding bits and passed to the output. Each input voltage enabled needs a corresponding level shifter 206. When the input voltage is negative, the first global wordline driver 202 also utilizes a triple well level shifter 208 (e.g., a different level shifter with triple well (TW) devices) to support negative values (e.g., which are typically very large as compared to regular NMOS/PMOS values). All the bias pass gates on negative voltage nodes will have a triple well level shifter 208 on outputs. If the input voltage is very high (e.g., like around twenty seven volts) the first global wordline driver 202 utilizes a different level shifter with devices to support high voltage. All these level shifters occupy about eighty percent of the area in the first global wordline driver 202.

The first global wordline driver 202 is typically repeated by the number of wordlines (e.g., 240 times). In the illustrated example, the first global wordline driver 202 supports a first plane (plane X), while a second global wordline driver 204 supports a second plane (plane Y). Each plane needs to have 240 of such global wordline drivers, as shown for plane X and plane Y in FIG. 2.

Figure 3:
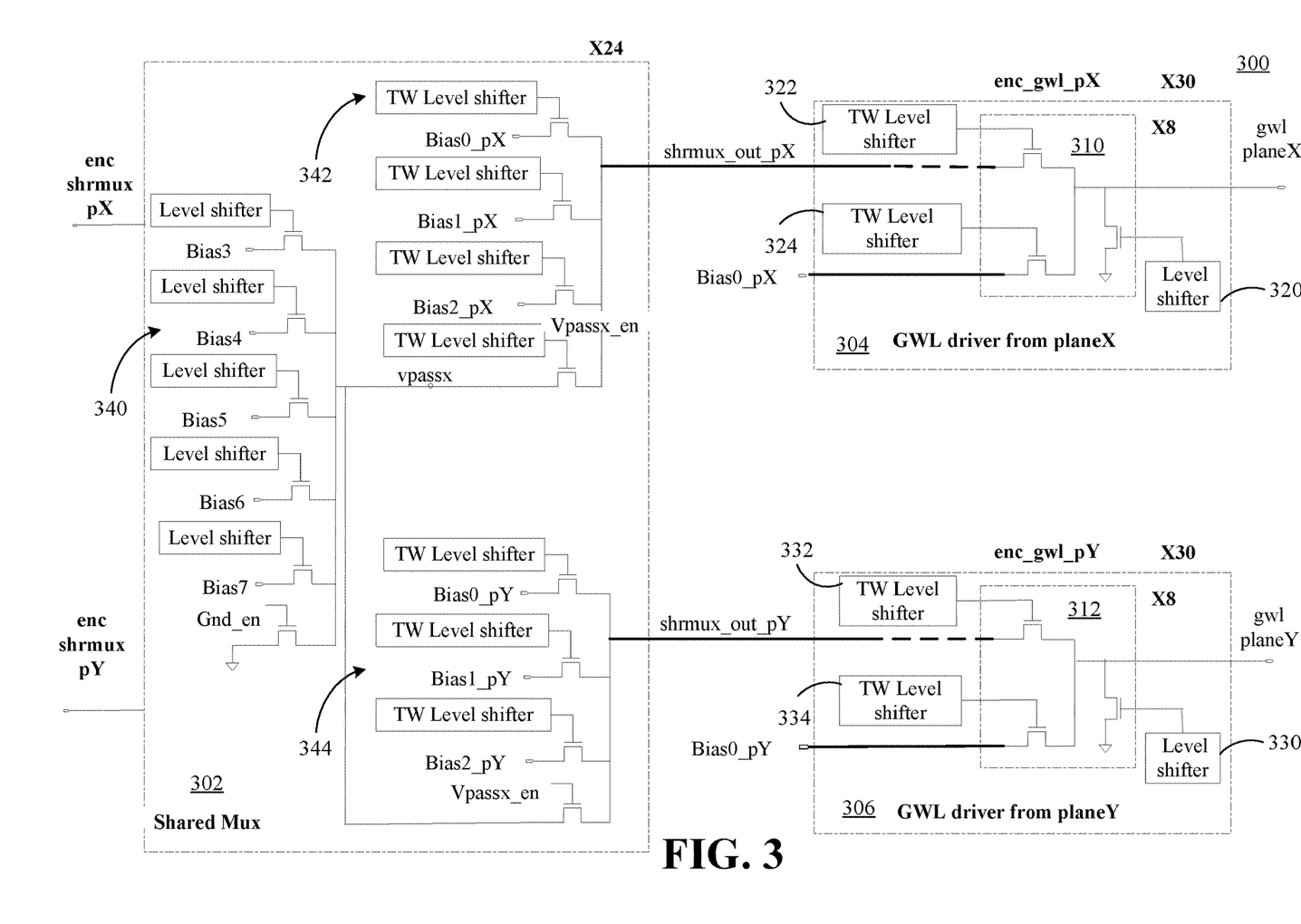
FIG. 3 is a block diagram of an example wordline system according to an embodiment.

FIG. 3 is a block diagram of an example wordline system 300 according to an embodiment. As illustrated, the wordline system 300 may be included as part of memory device 100 (e.g., in one or more decks) (e.g., see FIG. 1).

To reduce area, voltages are first processed by a shared multiplexer 302 and shared with multiple wordline drivers, illustrated here as first grouped global wordline driver 304 and second grouped global wordline driver 306. Accordingly, a single shared multiplexer 302 is shared by a plurality of grouped global wordline drivers where each grouped global wordline driver (e.g., first grouped global wordline driver 304, second grouped global wordline driver 306, etc.) is associated with a particular plane.

Additionally, the first grouped global wordline driver 304 has a repeated portion 310 that is duplicated for each of a plurality of wordlines. In the illustrated example, the repeated portion 310 is duplicated eight times to correspond with eight wordlines. Similarly, the second grouped global wordline driver 306 has a repeated portion 312 that is duplicated for each of a plurality of wordlines.

As illustrated, the first grouped global wordline driver 304 is capable of having only three level shifters with pass gates. For example, the first grouped global wordline driver 304 has a first shared level shifter 320, a first shared multi-well level shifter 322, and a second shared multi-well level shifter 324. The first shared level shifter 320, first shared multi-well level shifter 322, and second shared multi-well level shifter 324 are all associated with the repeated portion 310 that is duplicated for each of a plurality of wordlines. This combination of elements is repeated multiple times (e.g., repeated thirty times in the illustrated example. Similarly, the second grouped global wordline driver 306 has a second shared level shifter 330, a third shared multi-well level shifter 332, and a fourth shared multi-well level shifter 334. The second shared level shifter 330, third shared multi-well level shifter 332, and fourth shared multi-well level shifter 334 are all associated with the repeated portion 312 that is duplicated for each of a plurality of wordlines.

Advantageously, the number of drivers with level shifters is reduced from 240 to 30 per plane as compared to the device illustrated in FIG. 2. For example, the drivers without level shifters (e.g., those within the repeated portion 310 and the repeated portion 312) are very small compared to ones with level shifters. Additionally, all other bias voltages are capable of being processed by the shared multiplexer 302. In the illustrated example, the shared multiplexer 302 is advantageously capable of being repeated only 24 times to support inhibit scheme for +/−8 wordlines.

In operation, the shared multiplexer 302 is to access data state information from a plurality of memory cells. The first grouped global wordline driver 304 is coupled to the shared multiplexer 302 and is to output a first plurality of wordlines associated with a first plane (e.g., plane X). The second grouped global wordline driver 306 is coupled to the shared multiplexer and is to output a second plurality of wordlines associated with a second plane (e.g., plane Y), where the second plane is different than the first plane.

The shared multiplexer 302 includes a plurality of level shifters 340, a first plurality of multi-well level shifters 342, and a second plurality of multi-well level shifters 344. Advantageously, the shared multiplexer 302 is capable of being limited to five of the plurality of level shifters 340. The first plurality of multi-well level shifters 342 is coupled to an output of the plurality of level shifters 340. The first plurality of multi-well level shifters 342 is to generate a first decoded data state of the shared multiplexer 302 associated with the first plane (e.g., plane X). The second plurality of multi-well level shifters 344 is coupled to the output of the plurality of level shifters 302. The second plurality of multi-well level shifters 344 is to generate a second decoded data state of the shared multiplexer associated with the second plane (e.g., plane Y). In the illustrated example, the first plurality of multi-well level shifters 342 and the second plurality of multi-well level shifters 344 are triple well level shifters. The first grouped global wordline driver 304 is coupled to an output of the first plurality of multi-well level shifters 342 from the shared multiplexer 302. Similarly, the second grouped global wordline driver 306 is coupled to an output of the second plurality of multi-well level shifters 344 from the shared multiplexer 302.

As described above, the first grouped global wordline driver 304 includes the first shared level shifter 320. The first shared level shifter 320 is to drive a first plurality of pass gates, wherein the second grouped global wordline driver comprises a second shared level shifter, wherein the second level shifter is to drive a second plurality of pass gates.

As described above, the first grouped global wordline driver 304 includes the first shared multi-well level shifter 322, the first shared multi-well level shifter 322, and the second shared multi-well level shifter 324. The first shared multi-well level shifter 322 is to drive a first plurality of multi-well pass gates contained in the repeated portion 310. The first shared multi-well level shifter 322 is to receive the first decoded data state of the shared multiplexer 302 associated with the first plane (e.g., plane X). The first shared level shifter 320 is coupled to the first shared multi-well level shifter 322 and the second shared multi-well level shifter 324. The second shared multi-well level shifter 324 is to drive a second plurality of multi-well pass gates contained in the repeated portion 310. The second shared multi-well level shifter 324 is to receive a first pass gate voltage associated with the first plane (e.g., plane X).

Similarly, the second grouped global wordline driver 306 includes the second shared level shifter 330, the third shared multi-well level shifter 332, and the fourth shared multi-well level shifter 334. The second shared level shifter 320 is coupled to the third shared multi-well level shifter 332 and the fourth shared multi-well level shifter 334. The third shared multi-well level shifter 332 is to drive a third plurality of multi-well pass gates contained in the repeated portion 312. The third shared multi-well level shifter 332 is to receive the second decoded data state of the shared multiplexer 302 associated with the second plane (e.g., plane Y). The fourth shared multi-well level shifter 334 is to drive a fourth plurality of multi-well pass gates contained in the repeated portion 312. The fourth shared multi-well level shifter 334 is to receive a second pass gate voltage associated with the second plane (e.g., plane Y).

Figure 4:
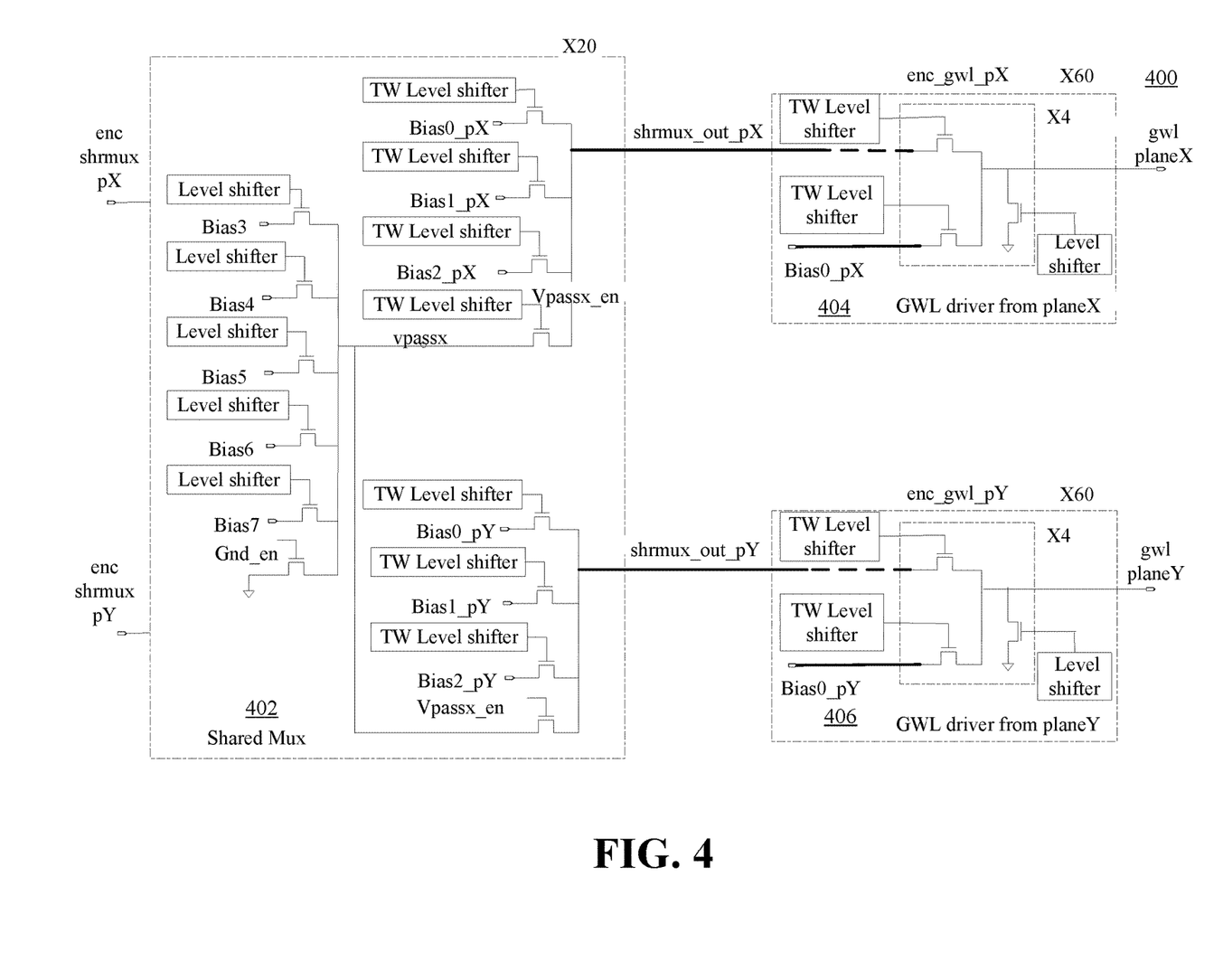
FIG. 4 is a block diagram of another example wordline system according to an embodiment.

FIG. 4 is a block diagram of another example wordline system 400 according to an embodiment. The number of wordlines grouped is capable of being scaled. For example, number of wordlines grouped could be scaled to 4, 8, 16, 32 wordlines, etc.

In the illustrated example, four wordlines are grouped instead of eight wordlines (e.g., as illustrated in FIG. 3). In such an example, there will be sixty grouped global wordline drivers per plane (e.g., sixty of first grouped global wordline driver 404 for plane X and sixty of second grouped global wordline driver 406 for plane Y) and there will be twenty of shared multiplexer 402. In another implementation, if an inhibit scheme does not need to be supported (e.g., for +/−8 WLs and only +/−4 WLs) then only twelve shared multiplexers may be used instead.

Figure 5:
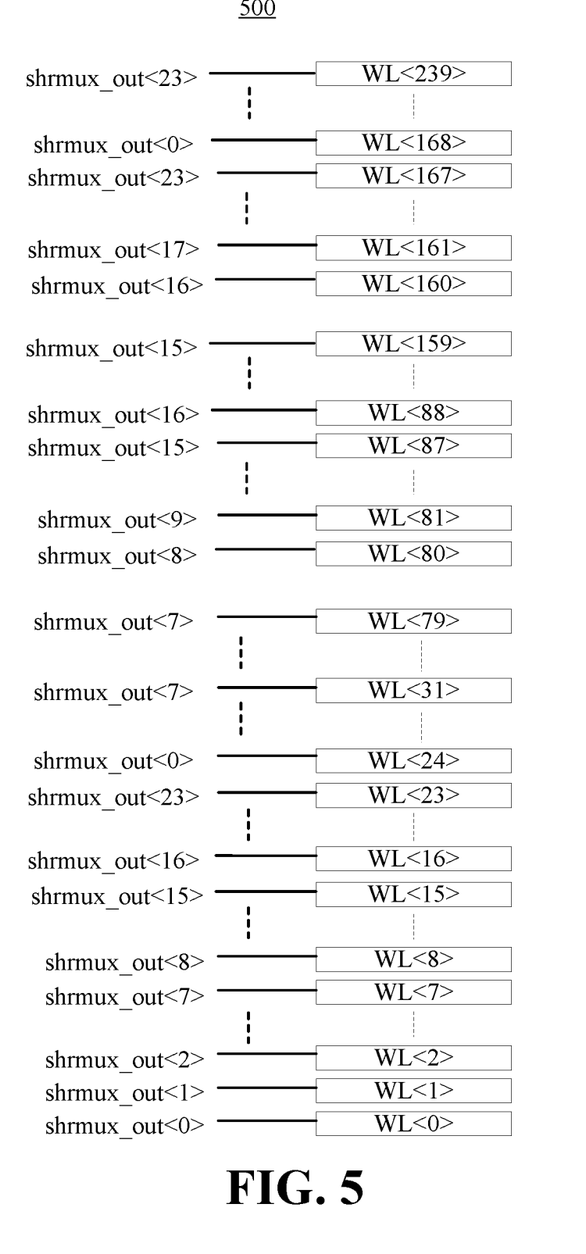
FIG. 5 is a diagram of an example of a rotating output connection from a shared multiplexer according to an embodiment.

FIG. 5 is a diagram of an example of a rotating output connection 500 from a shared multiplexer according to an embodiment. As illustrated, each shared multiplexer output is capable of being connected to wordlines in a rotated fashion. For example, 'shrmux_out<0>' is connected to WL<0>, 'shrmux_out<1>' is connected to WL<1>, and so on. Likewise, 'shrmux_out<23>' is connected to WL<23> and rotated repeated again so 'shrmux_out<0>' is connected to WL<24>, as illustrated here. In the illustrated example implementation, each shared multiplexer output is connected to ten wordlines from a plane.

Figure 6:
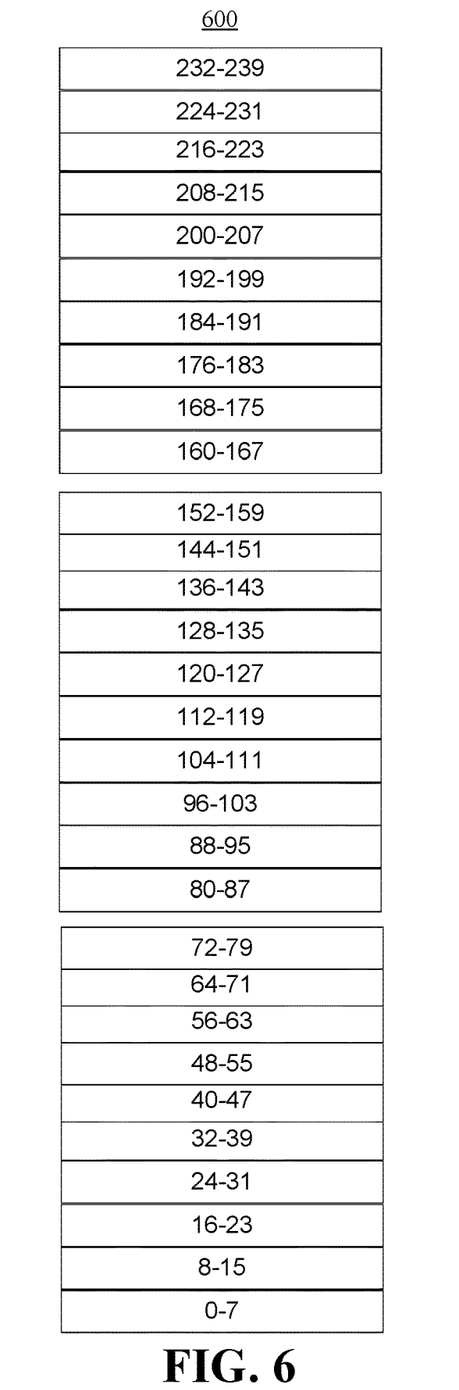
FIG. 6 is a diagram of an example of a grouping wordlines together according to an embodiment.

FIG. 6 is a diagram of an example of a wordline grouping 600 according to an embodiment. As illustrated, each group of wordlines can be connected to shared multiplexer output, or bias voltage (e.g., Bias0_pX), or to the ground. The wordlines are grouped into eight in this example, although other groupings are capable of being used. During any algorithm depending on the selected wordline, the corresponding wordline group (and +1, −1 groups if needed) can be connected to the shared multiplexer output to get different bias voltages and the remaining wordline groups are connected to bias voltage (e.g., Bias0_pX) or to the ground.

Advantageously, by grouping wordlines and sharing bias between multiple wordlines from multiple planes, the area of a device is capable of being reduced by 50%. All global wordline drivers within the periphery of a device. To scale with increasing number of wordlines in future generations, the wordlines can be grouped into 16 (or higher) to save more than 50% area to fit the global wordline drivers, in reduced periphery area.

Figure 7:
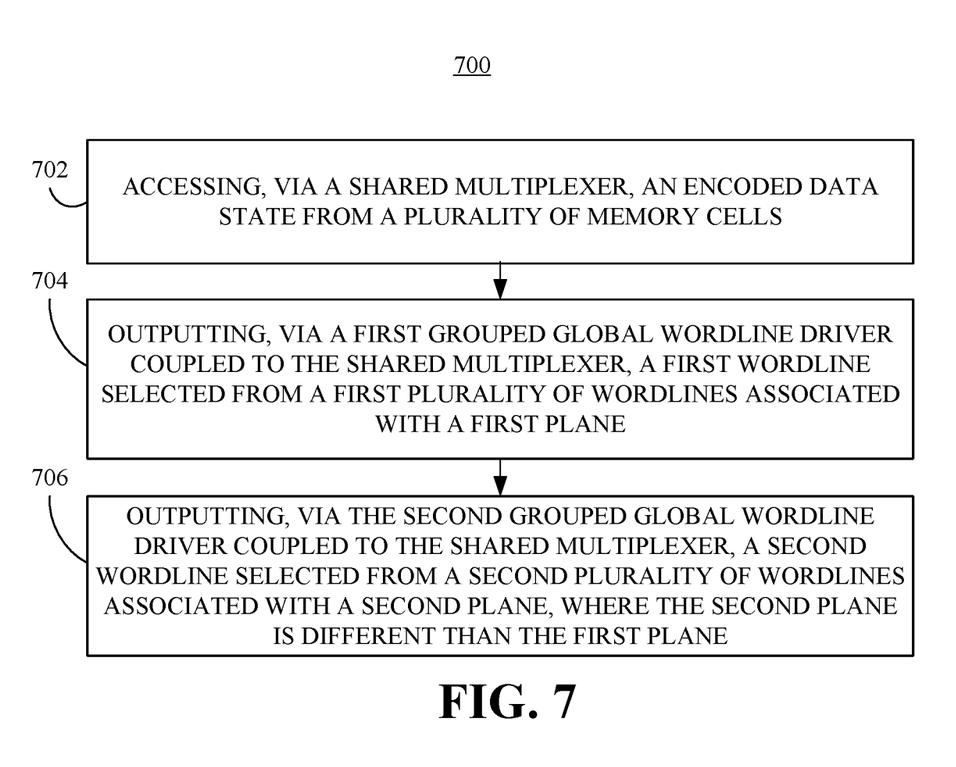
FIG. 7 is a flowchart of an example of another method of sharing a bias scheme for a grouped global wordline driver according to an embodiment.

FIG. 7 is a flowchart of an example of a method of sharing a bias scheme for a grouped global wordline driver according to an embodiment. The method 700 may generally be implemented in a memory device, such as, for example, the memory device 100 (e.g., see FIG. 1), already discussed.

Illustrated processing block 702 provides for accessing an encoded data state. For example, an encoded data state from a plurality of memory cells is accessed via a shared multiplexer.

Illustrated processing block 704 provides for outputting a first wordline. For example, a first wordline selected from a first plurality of wordlines associated with a first plane is output via a first grouped global wordline driver coupled to the shared multiplexer.

Illustrated processing block 706 provides for outputting a second wordline. For example, a second wordline selected from a second plurality of wordlines associated with a second plane is output via a second grouped global wordline driver coupled to the shared multiplexer. In such an example, the second plane is different than the first plane.

Additional and/or alternative operations for method 700 are described in greater detail below in the description of and FIG. 8.

Figure 8:
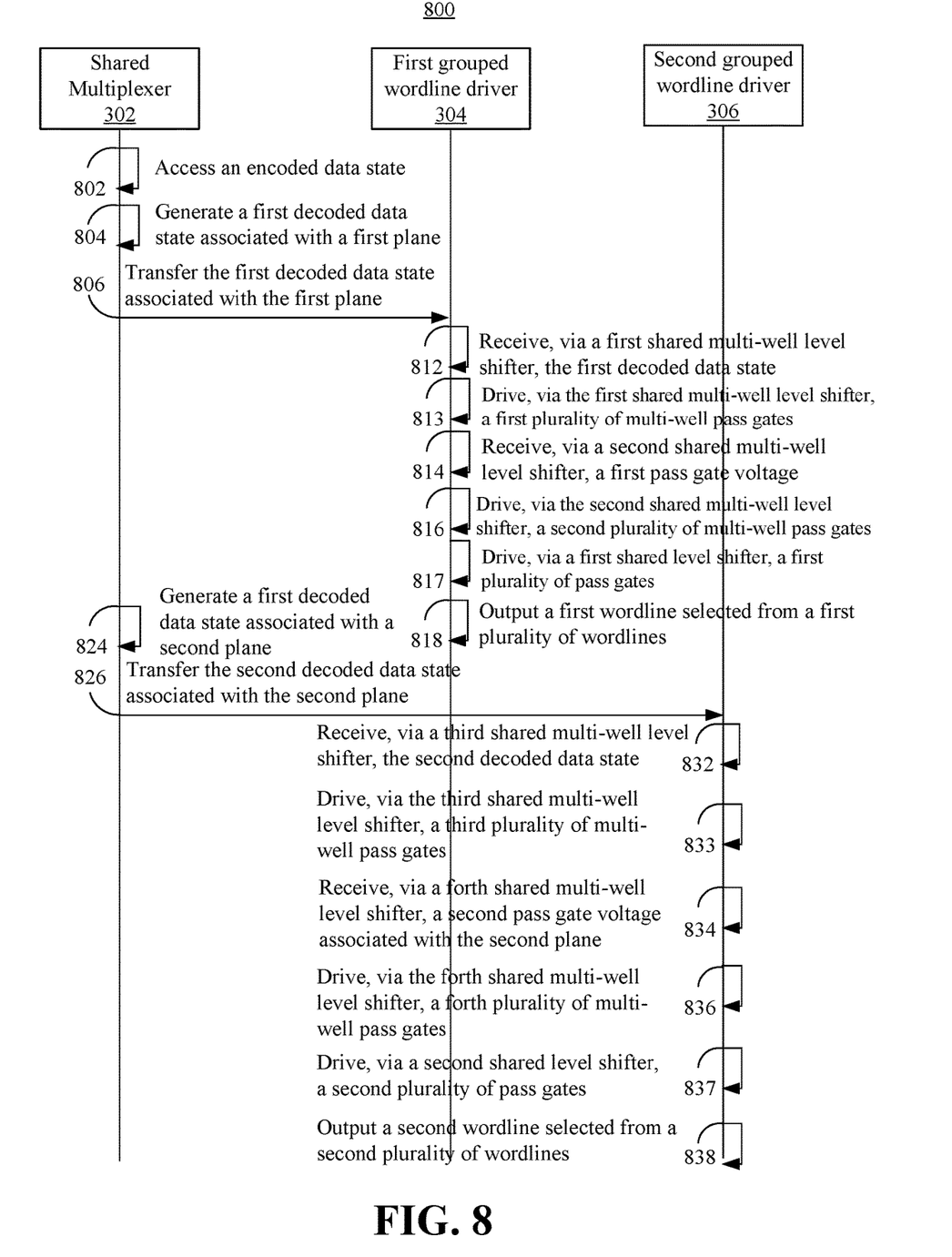
FIG. 8 is a flowchart of an example of a further method of sharing a bias scheme for a grouped global wordline driver according to an embodiment.

FIG. 8 is a flowchart of an example of a further method of sharing a bias scheme for a grouped global wordline driver according to an embodiment;

In the illustrated example, method 800 may be implemented via a shared multiplexer coupled to a first grouped global wordline driver 304 and second grouped global wordline driver 306.

Illustrated processing block 802 provides for accessing an encoded data state. For example, an encoded data state from a plurality of memory cells is accessed via a shared multiplexer.

Illustrated processing block 804 provides for generating a first decoded data state. For example, a first decoded data state of the shared multiplexer associated with the first plane is generated via a first plurality of multi-well level shifters coupled to an output of a plurality of level shifters of the shared multiplexer.

Illustrated processing block 806 provides for transferring the first decoded data state. For example, the first decoded data state associated with the first plane is transferred to the first grouped global wordline driver via the shared multiplexer.

Illustrated processing block 812 provides for receiving the first decoded data state. For example, the first decoded data state of the shared multiplexer associated with the first plane is received via a first shared multi-well level shifter of the first grouped global wordline driver.

Illustrated processing block 813 provides for driving a first plurality of multi-well pass gates. For example, a first plurality of multi-well pass gates are driven via the first shared multi-well level shifter.

Illustrated processing block 814 provides for receiving a first pass gate voltage. For example, a first pass gate voltage associated with the first plane is received via a second shared multi-well level shifter of the first grouped global wordline driver.

Illustrated processing block 816 provides for driving a second plurality of multi-well pass gates. For example, a second plurality of multi-well pass gates is driven based on the received pass gate voltage via the second shared multi-well level shifter.

Illustrated processing block 817 provides for driving a first plurality of pass gates. For example, a first plurality of pass gates are driven via a first shared level shifter of the first grouped global wordline driver.

Illustrated processing block 818 provides for outputting a first wordline. For example, a first wordline selected from a first plurality of wordlines associated with a first plane is output via a first grouped global wordline driver coupled to the shared multiplexer.

Illustrated processing block 824 provides for generating a second decoded data state. For example, a second decoded data state of the shared multiplexer associated with the second plane is generated via a second plurality of multi-well level shifters coupled to the output of the plurality of level shifters of the shared multiplexer, a second decoded data state.

Illustrated processing block 826 provides for transferring the second decoded data state. For example, the second decoded data state associated with the second plane is transferred to the second grouped global wordline driver via the shared multiplexer.

Illustrated processing block 832 provides for receiving the second decoded data state. For example, the second decoded data state of the shared multiplexer associated with the second plane is received via a third shared multi-well level shifter of the second grouped global wordline driver.

Illustrated processing block 833 provides for driving a third plurality of multi-well pass gates. For example, a third plurality of multi-well pass gates are driven via the third shared multi-well level shifter.

Illustrated processing block 834 provides for receiving a second pass gate voltage. For example, a second pass gate voltage associated with the second plane is received via a fourth shared multi-well level shifter of the second grouped global wordline driver.

Illustrated processing block 836 provides for driving a fourth plurality of multi-well pass gates. For example, a fourth plurality of multi-well pass gates are driven based on the received second pass gate voltage via the fourth shared multi-well level shifter.

Illustrated processing block 837 provides for driving a second plurality of pass gates. For example, a second plurality of pass gates are driven via a second shared level shifter of the second grouped global wordline driver.

Illustrated processing block 838 provides for outputting a second wordline. For example, a second wordline selected from a second plurality of wordlines associated with a second plane is output via a second grouped global wordline driver coupled to the shared multiplexer. In such an example, the second plane is different than the first plane.

Additional details regarding the various implementations of Method 700 are discussed below with regard to FIGS. 9 and 10.

Figure 9:
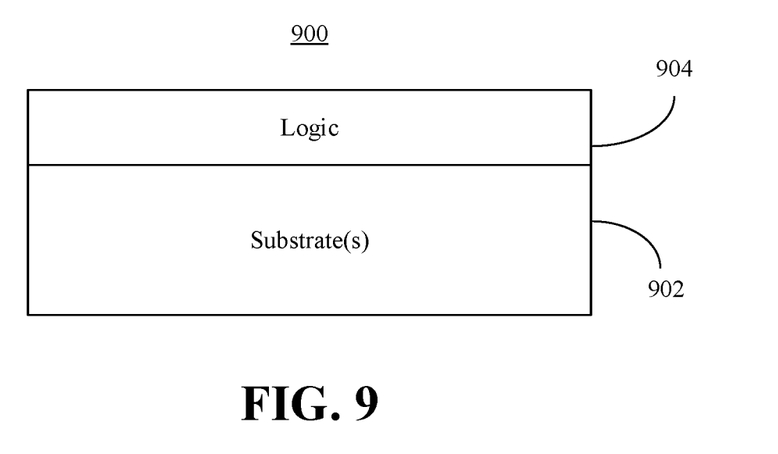
FIG. 9 is an illustration of an example of a semiconductor package apparatus according to an embodiment.

FIG. 9 shows a semiconductor apparatus 900 (e.g., chip, die, and/or package). The illustrated apparatus 900 includes one or more substrates 902 (e.g., silicon, sapphire, gallium arsenide) and logic 904 (e.g., transistor array and other integrated circuit/IC components) coupled to the substrate(s) 902. In an embodiment, the logic 904 implements one or more aspects of the method 700 (FIG. 7) and/or the method 800 (FIG. 8), already discussed.

Thus, the logic 904 is to access, via a shared multiplexer, an encoded data state from a plurality of memory cells. Additionally, the logic 904 is to output, via a first grouped global wordline driver coupled to the shared multiplexer, a first wordline selected from a first plurality of wordlines associated with a first plane. Further, the logic 904 is to output, via a second grouped global wordline driver coupled to the shared multiplexer, a second wordline selected from a second plurality of wordlines associated with a second plane, where the second plane is different than the first plane.

In one example, the logic 904 includes transistor channel regions that are positioned (e.g., embedded) within the substrate(s) 902. Thus, the interface between the logic 904 and the substrate 902 may not be an abrupt junction. The logic 904 may also be considered to include an epitaxial layer that is grown on an initial wafer of the substrate 802.

Figure 10:
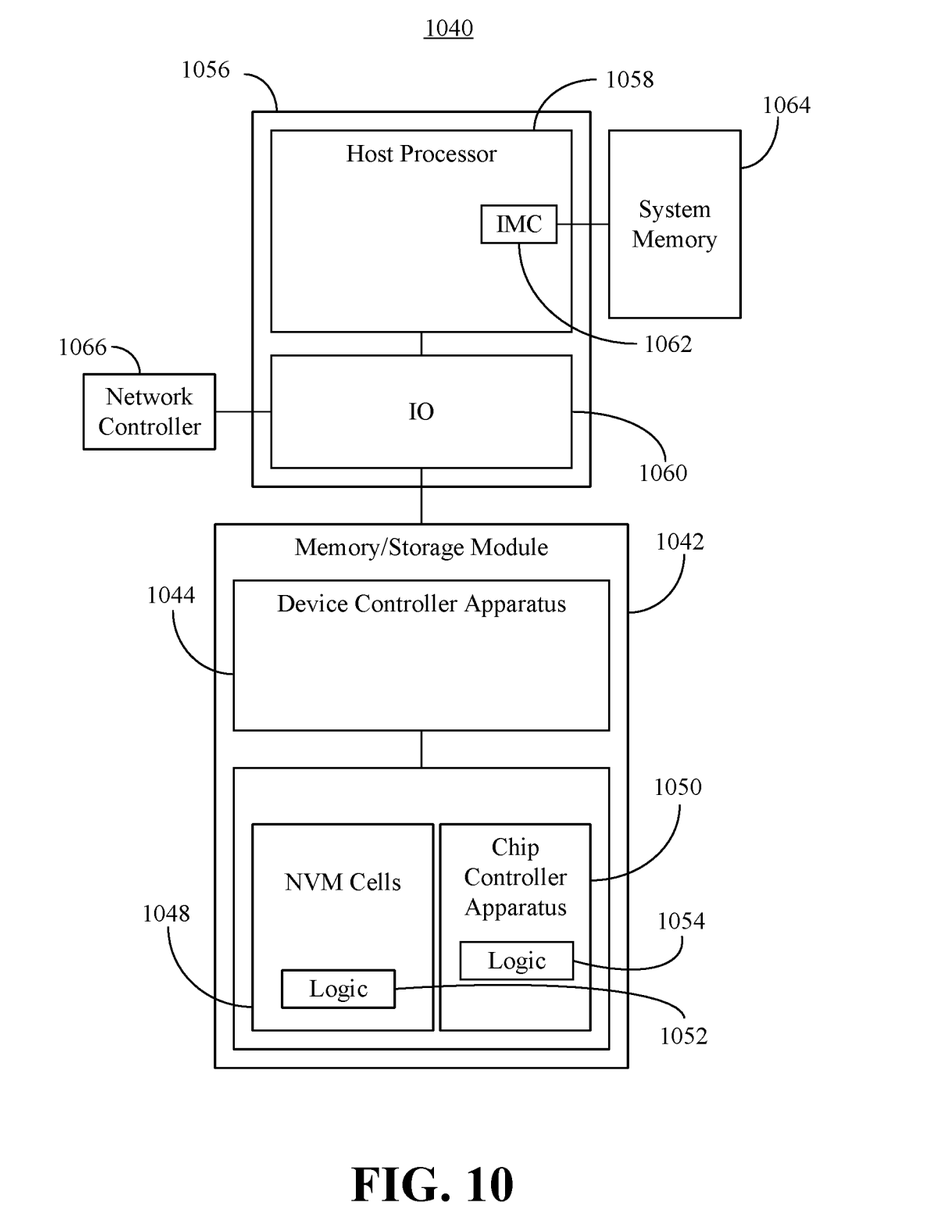
FIG. 10 is a block diagram of an example of a performance-enhanced computing system according to an embodiment.

Turning now to FIG. 10, a performance-enhanced computing system 1040 is shown. In the illustrated example, a solid state drive (SSD) 1042 includes a device controller apparatus 1044 that is coupled to a NAND 1046. The illustrated NAND 1046 includes a memory device 1048 having a set of multi-level NVM cells and logic 1052 (e.g., transistor array and other integrated circuit/IC components coupled to one or more substrates containing silicon, sapphire and/or gallium arsenide), and a chip controller apparatus 1050 that includes logic 1054. The logic 1054, which may include one or more of configurable or fixed-functionality hardware, may be configured to perform one or more aspects of the method 700 (FIG. 7) and/or the method 800 (FIG. 8), already discussed.

Thus, the logic 1052 is to access, via a shared multiplexer, an encoded data state from a plurality of memory cells. Additionally, the logic 1052 is to output, via a first grouped global wordline driver coupled to the shared multiplexer, a first wordline selected from a first plurality of wordlines associated with a first plane. Further, the logic 1052 is to output, via a second grouped global wordline driver coupled to the shared multiplexer, a second wordline selected from a second plurality of wordlines associated with a second plane, where the second plane is different than the first plane.

The illustrated system 1040 also includes a system on chip (SoC) 1056 having a host processor 1058 (e.g., central processing unit/CPU) and an input/output (I/O) module 1060. The host processor 1058 may include an integrated memory controller 1062 (WIC) that communicates with system memory 1064 (e.g., RAM dual inline memory modules/DIMMs). The illustrated TO module 1060 is coupled to the SSD 1042 as well as other system components such as a network controller 1066.

Additional Notes and Examples

Example 1 includes a memory device comprising a shared multiplexer, a first grouped global wordline driver, and a second grouped global wordline driver. The shared multiplexer is to access data state information from a plurality of memory cells. The first grouped global wordline driver coupled to the shared multiplexer is to output a first plurality of wordlines associated with a first plane. The second grouped global wordline driver coupled is to the shared multiplexer to output a second plurality of wordlines associated with a second plane, where the second plane is different than the first plane.

Example 2 includes the memory device of Example 1, where the first grouped global wordline driver comprises a first shared level shifter, where the first shared level shifter is to drive a first plurality of pass gates, where the second grouped global wordline driver comprises a second shared level shifter, where the second shared level shifter is to drive a second plurality of pass gates.

Example 3 includes the memory device of Example 2, where the shared multiplexer, comprises a plurality of level shifters, a first plurality of multi-well level shifters, and a second plurality of multi-well level shifters. The first plurality of multi-well level shifters is coupled to an output of the plurality of level shifters, where the first plurality of multi-well level shifters is to generate a first decoded data state of the shared multiplexer associated with the first plane. The second plurality of multi-well level shifters is coupled to the output of the plurality of level shifters, where the second plurality of multi-well level shifters is to generate a second decoded data state of the shared multiplexer associated with the second plane.

Example 4 includes the memory device of Example 3, where the first and second plurality of multi-well level shifters comprise triple well level shifters.

Example 5 includes the memory device of Example 3, where the shared multiplexer is limited to five of the plurality of level shifters.

Example 6 includes the memory device of Example 3, where the first grouped global wordline driver is coupled to an output of the first plurality of multi-well level shifters from the shared multiplexer, and where the second grouped global wordline driver is coupled to an output of the second plurality of multi-well level shifters from the shared multiplexer.

Example 7 includes the memory device of Example 6, where the first grouped global wordline driver, further comprises a first shared multi-well level shifter and a second shared multi-well level shifter. The first shared multi-well level shifter is to drive a first plurality of multi-well pass gates, where the first shared multi-well level shifter is to receive the first decoded data state of the shared multiplexer associated with the first plane. The second shared multi-well level shifter is to drive a second plurality of multi-well pass gates, where the second shared multi-well level shifter is to receive a first pass gate voltage associated with the first plane, where the first shared level shifter is coupled to the first and second shared multi-well level shifters.

Example 8 includes the memory device of Example 7, where the second grouped global wordline driver, further comprises a third shared multi-well level shifter and a fourth shared multi-well level shifter. The third shared multi-well level shifter is to drive a third plurality of multi-well pass gates, where the third shared multi-well level shifter is to receive the second decoded data state of the shared multiplexer associated with the second plane. The fourth shared multi-well level shifter is to drive a fourth plurality of multi-well pass gates, where the fourth shared multi-well level shifter is to receive a second pass gate voltage associated with the second plane, where the second shared level shifter is coupled to the third and fourth shared multi-well level shifters.

Example 9 includes a system comprising a memory controller and a multi-deck non-volatile memory structure coupled to the memory controller. The multi-deck non-volatile memory structure comprises a plurality of decks, at least one of the plurality of decks comprising a shared multiplexer, a first grouped global wordline driver, and a second grouped global wordline driver. The shared multiplexer is to access data state information from a plurality of memory cells. The first grouped global wordline driver coupled to the shared multiplexer is to output a first plurality of wordlines associated with a first plane. The second grouped global wordline driver coupled to the shared multiplexer is to output a second plurality of wordlines associated with a second plane, where the second plane is different than the first plane.

Example 10 includes the system of Example 9, where the first grouped global wordline driver comprises a first shared level shifter, where the first level shifter is to drive a first plurality of pass gates, where the second grouped global wordline driver comprises a second shared level shifter, and where the second level shifter is to drive a second plurality of pass gates.

Example 11 includes the system of Example 10, where the shared multiplexer comprises a plurality of level shifters, a first plurality of multi-well level shifters, and a second plurality of multi-well level shifters. The first plurality of multi-well level shifters is coupled to an output of the plurality of level shifters, where the first plurality of multi-well level shifters is to generate a first decoded data state of the shared multiplexer associated with the first plane. The second plurality of multi-well level shifters is coupled to the output of the plurality of level shifters, where the second plurality of multi-well level shifters is to generate a second decoded data state of the shared multiplexer associated with the second plane.

Example 12 includes the system of Example 11, where the first and second plurality of multi-well level shifters comprise triple well level shifters.

Example 13 includes the system of Example 11, where the shared multiplexer is limited to five of the plurality of level shifters.

Example 14 includes the system of Example 11, where the first grouped global wordline driver is coupled to an output of the first plurality of multi-well level shifters from the shared multiplexer, and where the second grouped global wordline driver is coupled to an output of the second plurality of multi-well level shifters from the shared multiplexer.

Example 15 includes the system of Example 14, where the first grouped global wordline driver further comprises a first shared multi-well level shifter and a second shared multi-well level shifter. The first shared multi-well level shifter is to drive a first plurality of multi-well pass gates, where the first shared multi-well level shifter is to receive the first decoded data state of the shared multiplexer associated with the first plane. The second shared multi-well level shifter is to drive a second plurality of multi-well pass gates, where the second shared multi-well level shifter is to receive a first pass gate voltage associated with the first plane, and where the first shared level shifter is coupled to the first and second shared multi-well level shifters.

Example 16 includes the system of Example 15, where the second grouped global wordline driver further comprises a third shared multi-well level shifter and a fourth shared multi-well level shifter. The third shared multi-well level shifter is to drive a third plurality of multi-well pass gates, where the third shared multi-well level shifter is to receive the decoded data state output of the shared multiplexer associated with the second plane. The fourth shared multi-well level shifter is to drive a fourth plurality of multi-well pass gates, where the fourth shared multi-well level shifter is to receive a second pass gate voltage associated with the second plane, where the second shared level shifter is coupled to the third and fourth shared multi-well level shifters.

Example 17 includes a method comprising accessing, via a shared multiplexer, an encoded data state from a plurality of memory cells; outputting, via a first grouped global wordline driver coupled to the shared multiplexer, a first wordline selected from a first plurality of wordlines associated with a first plane; and outputting, via a second grouped global wordline driver coupled to the shared multiplexer, a second wordline selected from a second plurality of wordlines associated with a second plane, where the second plane is different than the first plane.

Example 18 includes the method of Example 17, further comprising: driving, via a first shared level shifter of the first grouped global wordline driver, a first plurality of pass gates; and driving, via a second shared level shifter of the second grouped global wordline driver, a second plurality of pass gates.

Example 19 includes the method of Example 18, further comprising: generating, via a first plurality of multi-well level shifters coupled to an output of a plurality of level shifters of the shared multiplexer, a first decoded data state of the shared multiplexer associated with the first plane; transferring, via the shared multiplexer, the first decoded data state associated with the first plane to the first grouped global wordline driver; generating, via a second plurality of multi-well level shifters coupled to the output of the plurality of level shifters of the shared multiplexer, a second decoded data state of the shared multiplexer associated with the second plane; and transferring, via the shared multiplexer, the second decoded data state associated with the second plane to the second grouped global wordline driver.

Example 20 includes the method of Example 19, further comprising: receiving, via a first shared multi-well level shifter of the first grouped global wordline driver, the first decoded data state of the shared multiplexer associated with the first plane; driving, via the first shared multi-well level shifter, a first plurality of multi-well pass gates; receiving, via a second shared multi-well level shifter of the first grouped global wordline driver, a first pass gate voltage associated with the first plane; driving, via the second shared multi-well level shifter, a second plurality of multi-well pass gates based on the received pass gate voltage; receiving, via a third shared multi-well level shifter of the second grouped global wordline driver, the second decoded data state of the shared multiplexer associated with the second plane; driving, via the third shared multi-well level shifter, a third plurality of multi-well pass gates; receiving, via a fourth shared multi-well level shifter of the second grouped global wordline driver, a second pass gate voltage associated with the second plane; and driving, via the fourth shared multi-well level shifter, a fourth plurality of multi-well pass gates based on the received second pass gate voltage.

Example 21 includes an apparatus comprising means for performing the method of any one of Examples 17 to 20.

Example 22 includes a machine-readable storage comprising machine-readable instructions which, when executed, implement the method of any one of Examples 17 to 20.

Technology described herein therefore provides the capability to reducing the circuit occupancy of global wordline drivers by as much as fifty percent compared to existing approaches, which improves performance by increasing the number of wordlines that can be supported in a device of a given size. Advantageously, by grouping and sharing bias between multiple drivers, 3.5 mm$^2$ area may be saved by reducing the circuit occupancy by as much as fifty percent compared to existing approaches. The techniques described herein are also scalable for future generation, to handle further wordline increases grouping of wordlines can be extended beyond eight wordlines.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory device comprising:
   a shared multiplexer to access data state information from a plurality of memory cells;
   a first grouped global wordline driver coupled to the shared multiplexer to output a first plurality of wordlines associated with a first plane; and
   a second grouped global wordline driver coupled to the shared multiplexer to output a second plurality of wordlines associated with a second plane, wherein the second plane is different than the first plane.

2. The memory device of claim 1, wherein the first grouped global wordline driver comprises a first shared level shifter, wherein the first shared level shifter is to drive a first plurality of pass gates, wherein the second grouped global wordline driver comprises a second shared level shifter, and wherein the second shared level shifter is to drive a second plurality of pass gates.

3. The memory device of claim 2, wherein the shared multiplexer comprises:
   a plurality of level shifters;
   a first plurality of multi-well level shifters coupled to an output of the plurality of level shifters, wherein the first plurality of multi-well level shifters is to generate a first decoded data state of the shared multiplexer associated with the first plane; and
   a second plurality of multi-well level shifters coupled to the output of the plurality of level shifters, wherein the second plurality of multi-well level shifters is to generate a second decoded data state of the shared multiplexer associated with the second plane.

4. The memory device of claim 3, wherein the first and second plurality of multi-well level shifters comprise triple well level shifters.

5. The memory device of claim 3, wherein the shared multiplexer is limited to five of the plurality of level shifters.

6. The memory device of claim 3, wherein the first grouped global wordline driver is coupled to an output of the first plurality of multi-well level shifters from the shared multiplexer, and wherein the second grouped global wordline driver is coupled to an output of the second plurality of multi-well level shifters from the shared multiplexer.

7. The memory device of claim 6, wherein the first grouped global wordline driver further comprises:
   a first shared multi-well level shifter to drive a first plurality of multi-well pass gates, wherein the first shared multi-well level shifter is to receive the first decoded data state of the shared multiplexer associated with the first plane; and
   a second shared multi-well level shifter to drive a second plurality of multi-well pass gates, wherein the second shared multi-well level shifter is to receive a first pass gate voltage associated with the first plane,
   wherein the first shared level shifter is coupled to the first and second shared multi-well level shifters.

8. The memory device of claim 7, wherein the second grouped global wordline driver further comprises:
   a third shared multi-well level shifter to drive a third plurality of multi-well pass gates, wherein the third shared multi-well level shifter is to receive the second decoded data state of the shared multiplexer associated with the second plane; and
   a fourth shared multi-well level shifter to drive a fourth plurality of multi-well pass gates, wherein the fourth shared multi-well level shifter is to receive a second pass gate voltage associated with the second plane,
   wherein the second shared level shifter is coupled to the third and fourth shared multi-well level shifters.

9. A system comprising:
   a memory controller; and
   a multi-deck non-volatile memory structure coupled to the memory controller, the multi-deck non-volatile memory structure comprising a plurality of decks, at least one of the plurality of decks comprising:
      a shared multiplexer to access data state information from a plurality of memory cells;

a first grouped global wordline driver coupled to the shared multiplexer to output a first plurality of wordlines associated with a first plane; and a second grouped global wordline driver coupled to the shared multiplexer to output a second plurality of wordlines associated with a second plane, wherein the second plane is different than the first plane.

10. The system of claim 9, wherein the first grouped global wordline driver comprises a first shared level shifter, wherein the first shared level shifter is to drive a first plurality of pass gates, wherein the second grouped global wordline driver comprises a second shared level shifter, and wherein the second shared level shifter is to drive a second plurality of pass gates.

11. The system of claim 10, wherein the shared multiplexer comprises:
   a plurality of level shifters;
   a first plurality of multi-well level shifters coupled to an output of the plurality of level shifters, wherein the first plurality of multi-well level shifters is to generate a first decoded data state of the shared multiplexer associated with the first plane; and
   a second plurality of multi-well level shifters coupled to the output of the plurality of level shifters, wherein the second plurality of multi-well level shifters is to generate a second decoded data state of the shared multiplexer associated with the second plane.

12. The system of claim 11, wherein the first and second plurality of multi-well level shifters comprise triple well level shifters.

13. The system of claim 11, wherein the shared multiplexer is limited to five of the plurality of level shifters.

14. The system of claim 11, wherein the first grouped global wordline driver is coupled to an output of the first plurality of multi-well level shifters from the shared multiplexer, and wherein the second grouped global wordline driver is coupled to an output of the second plurality of multi-well level shifters from the shared multiplexer.

15. The system of claim 14, wherein the first grouped global wordline driver further comprises:
   a first shared multi-well level shifter to drive a first plurality of multi-well pass gates, wherein the first shared multi-well level shifter is to receive the first decoded data state of the shared multiplexer associated with the first plane; and
   a second shared multi-well level shifter to drive a second plurality of multi-well pass gates, wherein the second shared multi-well level shifter is to receive a first pass gate voltage associated with the first plane,
   wherein the first shared level shifter is coupled to the first and second shared multi-well level shifters.

16. The system of claim 15, wherein the second grouped global wordline driver further comprises:
   a third shared multi-well level shifter to drive a third plurality of multi-well pass gates, wherein the third shared multi-well level shifter is to receive the second decoded data state of the shared multiplexer associated with the second plane; and
   a fourth shared multi-well level shifter to drive a fourth plurality of multi-well pass gates, wherein the fourth shared multi-well level shifter is to receive a second pass gate voltage associated with the second plane,
   wherein the second shared level shifter is coupled to the third and fourth shared multi-well level shifters.

* * * * *